US010193714B2

(12) United States Patent
Kimura et al.

(10) Patent No.: US 10,193,714 B2
(45) Date of Patent: Jan. 29, 2019

(54) CONTINUOUS TIME PRE-CURSOR AND POST-CURSOR COMPENSATION CIRCUITS

(71) Applicant: Avago Technologies International Sales Pte. Limited, Singapore (SG)

(72) Inventors: Hiroshi Kimura, San Jose, CA (US); Haoqiong Chen, San Jose, CA (US); Yehui Sun, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/434,791

(22) Filed: Feb. 16, 2017

(65) Prior Publication Data

US 2018/0234270 A1 Aug. 16, 2018

(51) Int. Cl.
*H03H 7/30* (2006.01)
*H04L 25/03* (2006.01)
*H03K 19/0175* (2006.01)
*H03K 17/16* (2006.01)
*H04L 27/01* (2006.01)

(52) U.S. Cl.
CPC .. *H04L 25/03025* (2013.01); *H04L 25/03343* (2013.01); *H03K 17/161* (2013.01); *H03K 19/017509* (2013.01); *H04L 27/01* (2013.01)

(58) Field of Classification Search
CPC .......... H03K 17/161; H03K 19/017509; H04L 27/01; H04L 25/03885; H04L 25/0292
USPC ........................... 375/232, 233, 229; 327/359
See application file for complete search history.

(56) References Cited

U.S. PATENT DOCUMENTS

2012/0027074 A1* 2/2012 Raghavan ......... H04L 25/03057
375/233
2013/0208779 A1* 8/2013 Agrawal ................. H04L 27/01
375/232

OTHER PUBLICATIONS

Kiriaki, S. et al., "A 160Mhz Analog Equalizer for Magnetic Disk Read Channels," *IEEE International Solid-State Circuits Conference Digest of Technical Papers (ISSCC)*, pp. 322, 323, and 479, Feb. 8, 1997.
Lin, X. et al., "A 2.5- to 3.5-Gb/S Adaptive FIR Equalizer With Continuous-Time Wide-Bandwidth Delay Line in 0.25-µm CMOS," *IEEE Journal Of Solid-State Circuits*, vol. 41, No. 8, pp. 1908-1918, Aug. 2006.

(Continued)

*Primary Examiner* — Leila Malek
(74) *Attorney, Agent, or Firm* — Sterne, Kessler, Goldstein & Fox P.L.L.C.

(57) ABSTRACT

To improve on power and bandwidth limitations associated with conventional feedforward equalizer (FFE) implementations, the present disclosure provides intersymbol interference (ISI) compensation circuits that do not use delay cells common to FFE structures. In one example, the compensation circuit of the present disclosure comprises a two stage amplifier. Each stage of the amplifier is implemented using a differential pair with degeneration. One of the amplifier stages has a transfer function with a zero in the left half of the s-domain, also called the s-plane, and the other amplifier has a transfer function with a zero in the right half of the s-domain. The amplifier stage with the zero in the left half of the s-domain can be used to provide post-cursor ISI compensation, and the amplifier stage with the zero in the right half of the s-domain can be used to provide pre-cursor ISI compensation.

20 Claims, 6 Drawing Sheets

(56) References Cited

OTHER PUBLICATIONS

Maeng, M. et al., "0.18-µm CMOS Equalization Techniques for 10-Gb/s Fiber Optical Communication Links," *IEEE Transactions on Microwave Them, and Techniques*, vol. 53, No. 11, pp. 3509-3519, Nov. 2005.

Mammei, E. et al., "A Power-Scalable 7-Tap FIR Equalizer with Tunable Active Delay Line for 10-to-25 Gb/s Multi-Mode Fiber EDC in 28nm LP-CMOS," *IEEE International Solid-State Circuits Conference Digest of Technical Papers (ISSCC)*. p. 142 (3 pages), Feb. 11, 2014.

Momtaz, A. and Green, M.M., "An 80 mW 40 Gb/s 7-Tap T/2-Spaced Feed-Forward Equalizer in 65 nm CMOS," *IEEE Journal of Solid-State Circuits*, vol. 45, No. 3, p. 629-639, Mar. 2010.

Wu, H. et al., "Integrated Transversal Equalizers in High-Speed Fiber-Optic Systems," *IEEE Journal of Solid-State Circuits*, vol. 38, No. 12, pp. 2131-2137, Dec. 2003.

\* cited by examiner

CONTINUOUS TIME PRE-CURSOR AND POST-CURSOR COMPENSATION CIRCUITS

TECHNICAL FIELD

This application relates generally to continuous time equalization.

BACKGROUND

Communication systems are designed to transfer information between two devices over a medium in the presence of disturbing influences. Intersymbol interference (ISI) is one well-known disturbing influence in which transmitted symbols become elongated and interfere with adjacently transmitted symbols. This spreading of symbols is generally caused by the low-pass frequency response associated with all communication mediums. Because ISI has the same effect as noise, communication is made less reliable.

One of the most basic solutions for mitigating the effects of ISI is slowing down the speed at which symbols are transmitted over the medium. More specifically, the transmission speed can be slowed down such that a symbol is only transmitted after allowing previously transmitted symbol pulses to dissipate. The time it takes for a symbol pulse to dissipate is called delay spread, whereas the original time of the symbol pulse is called the symbol time. No ISI will occur if the delay spread is less than or equal to the symbol time.

Although slowing down the speed at which symbols are transmitted can eliminate or reduce the effects of ISI, it is generally an unacceptable solution for many of today's communication applications. In fact, many of today's communication applications require speeds in the tens of gigabits per second range. At such high speeds, ISI can completely overwhelm a signal transmitted over relatively small distances for given communication mediums (e.g., a few inches of printed circuit board trace or a few feet of copper cable).

Therefore, a filtering process, referred to as equalization, is often used to flatten the frequency response of a communication medium to mitigate the effects of ISI. Equalization can be applied at the receiver and/or at the transmitter.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of this discussion, the term "module" shall be understood to include software, firmware, or hardware (such as one or more circuits, microchips, processors, and/or devices), or any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

I. DELAY CELL BASED EQUALIZATION

Figure 1:
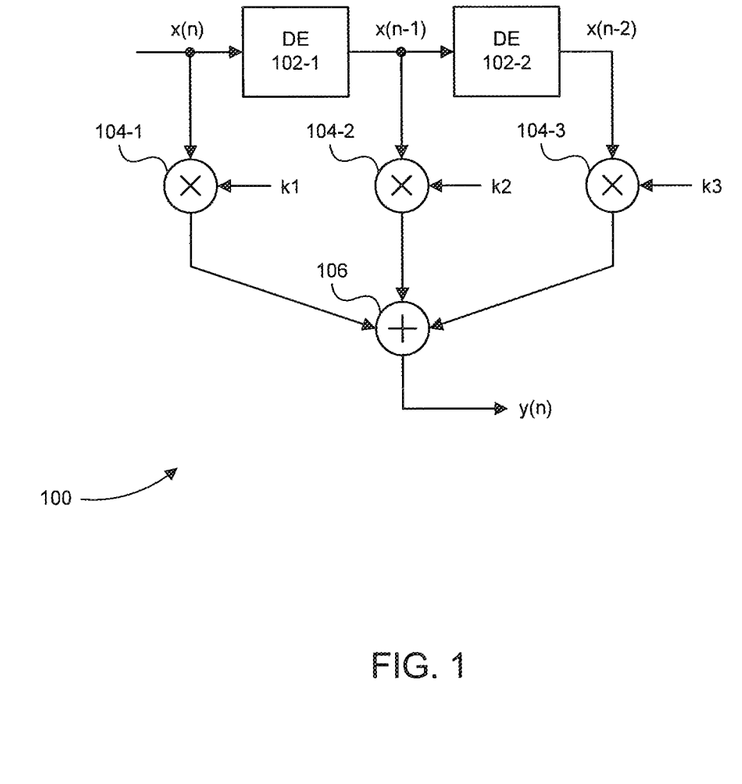
FIG. 1 illustrates a feedforward equalizer.

To provide some context for the system and method of the present disclosure, an example implementation of a feedforward equalizer (FFE) 100 is initially described with reference to FIG. 1. As shown in FIG. 1, FFE 100 includes two series coupled delay elements 102-1 and 102-2, multipliers 104-1, 104-2, and 104-3, and an adder 106. In general, FFE 100 is a linear equalizer that is commonly used in a receiver to reduce intersymbol interference (ISO. FFE 100 can reduce two types of ISI: pre-cursor ISI and post-cursor ISI. Pre-cursor ISI refers to interference caused by one or more symbols that are received after a current symbol, whereas post-cursor ISI refers to interference caused by one or more symbols that are received before a current symbol.

In operation, an input signal x propagates along the series coupled delay elements 102-1 and 102-2. Three successive symbols of the input signal x are tapped from the series coupled delay elements 102-1 and 102-2: x(n), x(n−1), and x(n−2), where x(n−2) is the first received symbol, x(n−1) is the second received symbol, and x(n) is the last received symbol. FFE 100 processes the symbol x(n−1) to reduce both pre-cursor ISI contributed by the symbol x(n) and post-cursor ISI contributed by the symbol x(n−2). To provide such ISI reduction, the tapped symbols are each multiplied by a respective one of tap weights (or filter coefficients) k1-k3 using multipliers 104-1 through 104-3 as shown in FIG. 1. In general, the tap weight k1 is related to the extent of pre-cursor ISI contributed by the symbol x(n) to the symbol x(n−1), and the tap weight k3 is related to the extent of post-cursor ISI contributed by the symbol x(n−2) to the symbol x(n−1).

After the symbols are multiplied by the tap weights k1-k3, the resulting products are added together using adder 106 to provide an ISI compensated version of the symbol x(n−1) or, more generally, an ISI compensated signal y(n). Removal of ISI, which effectively acts as noise, helps to ensure symbol values are decided correctly at a receiver.

One of the most common ways of implementing FFE 100 is in the digital domain using clocked sample and hold circuits (e.g., flip-flops) for delay elements 102-1 and 102-2, digital multipliers for multipliers 104-1 through 104-3, and a digital adder for adder 106. Although such a digital implementation can provide accurate time delays and a relatively linear performance, the digital implementation typically requires a large amount of power and can be complicated to implement due to the use of a clock signal.

Another common way of implementing FFE 100 is, at least in part, in the analog domain using continuous time delay cells for delay elements 102-1 and 102-2. However, for high speed applications the limited bandwidth of continuous time delay cells generally is insufficient. Also, such an implementation generally degrades linearity and increases noise.

It should be noted that there is only a single tap before and after the main tap x(n−1) in example FIFE 100. However, one of ordinary skill in the art will appreciate that in other implementations of FFE 100 more taps can be provided on either side of the main tap x(n−1) to provide further ISI compensation if needed or desired and that such an implementation would suffer from similar limitations described above.

II. NON-DELAY CELL BASED EQUALIZATION

To improve on power and bandwidth limitations associated with conventional FFE implementations as described above, the present disclosure provides ISI compensation circuits that do not use delay cells common to FFE structures. In one embodiment, the compensation circuit of the present disclosure comprises a two stage amplifier. Each stage of the amplifier is implemented using a differential pair with degeneration. One of the amplifier stages has a transfer function with a zero in the left half of the s-domain, also called the s-plane, and the other amplifier has a transfer function with a zero in the right half of the s-domain. The amplifier stage with the zero in the left half of the s-domain can be used to provide post-cursor ISI compensation, and the amplifier stage with the zero in the right half of the s-domain can be used to provide pre-cursor ISI compensation.

Figure 2:
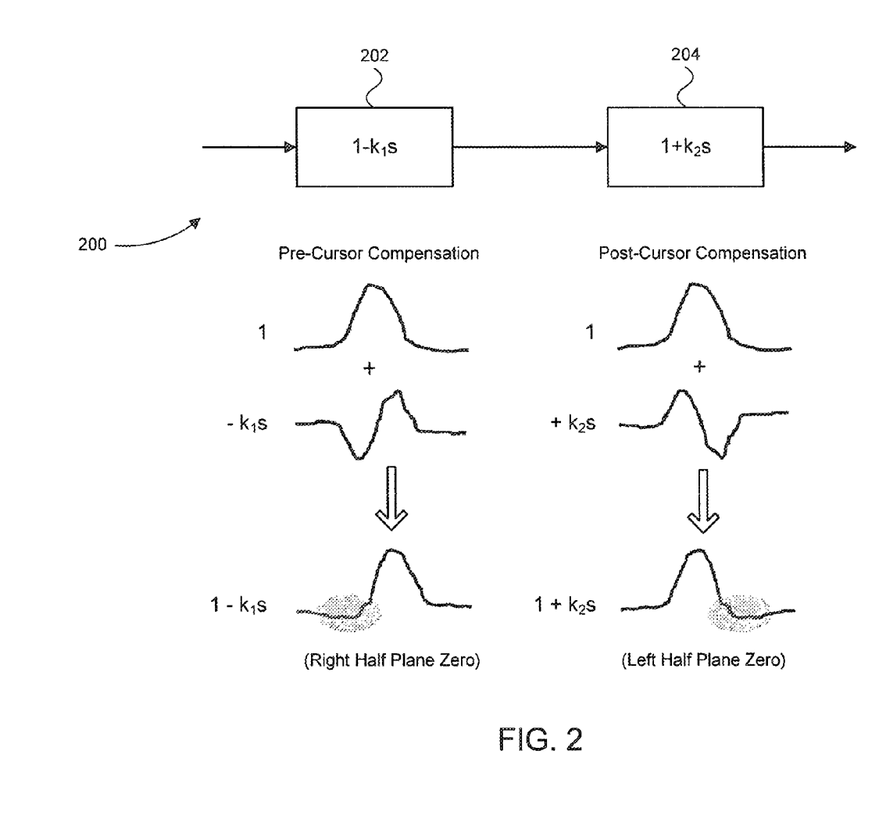
FIG. 2 illustrates a block diagram of an example implementation of the two-stage amplifier ISI compensation circuit in accordance with embodiments of the present disclosure.

FIG. 2 illustrates a block diagram 200 of an example implementation of the two-stage amplifier ISI compensation circuit in accordance with embodiments of the present disclosure. In particular, block diagram 200 includes a simplified transfer function 202 of the amplifier stage with the zero in the right half of the s-domain and a simplified transfer function 204 of the amplifier stage with the zero in the left half of the s-domain. The two transfer functions 202 and 204 are coupled in series in block diagram 200, with transfer function 202 preceding transfer function 204. However, it should be noted that in other embodiments, transfer function 204 can precede transfer function 202 in the series combination. It should be further noted that the reference to transfer functions 202 and 204 as being "simplified" transfer functions means that the transfer functions 202 and 204 can have other terms not shown in FIG. 2 (including those that contribute to additional zeroes or poles) but these additional terms generally do not influence the transfer functions to a large degree relative to the terms shown.

Below each transfer function 202 and 204, are time domain plots of implementations of the simplified transfer functions, with amplitude represented in the vertical direction of the time domain plots and time represented in the horizontal direction of the time domain plots. In particular, below transfer function 202, which is used to provide pre-cursor compensation, the time domain representation of the constant '1' in the s-domain is shown and the time domain representation of the pre-cursor compensation term "−$k_1$s" is shown. As can be seen from the time domain representations, the term "−$k_1$s" can provide attenuation to the part of the signal before (pre-) the main cursor (or main pulse). Similarly, below transfer function 204, which is used to provide post-cursor compensation, the time domain representation of the constant '1' in the s-domain is shown, and the time domain representation of the post-cursor compensation term "$k_2$s" is shown. As can be seen from the time domain representations, the term "$k_2$s" can provide attenuation to the part of the signal after (post-) the main cursor. Thus, transfer functions 202 and 204 can together provide both pre-cursor and post-cursor ISI compensation.

It should be noted that the constant '1' is used only for exemplary purposes and can have a different, constant value in other implementations. It should be further noted that the coefficients $k_1$ and $k_2$ can be adjusted to respectively vary the amount of pre-cursor and post-cursor compensation provided.

Figure 3:
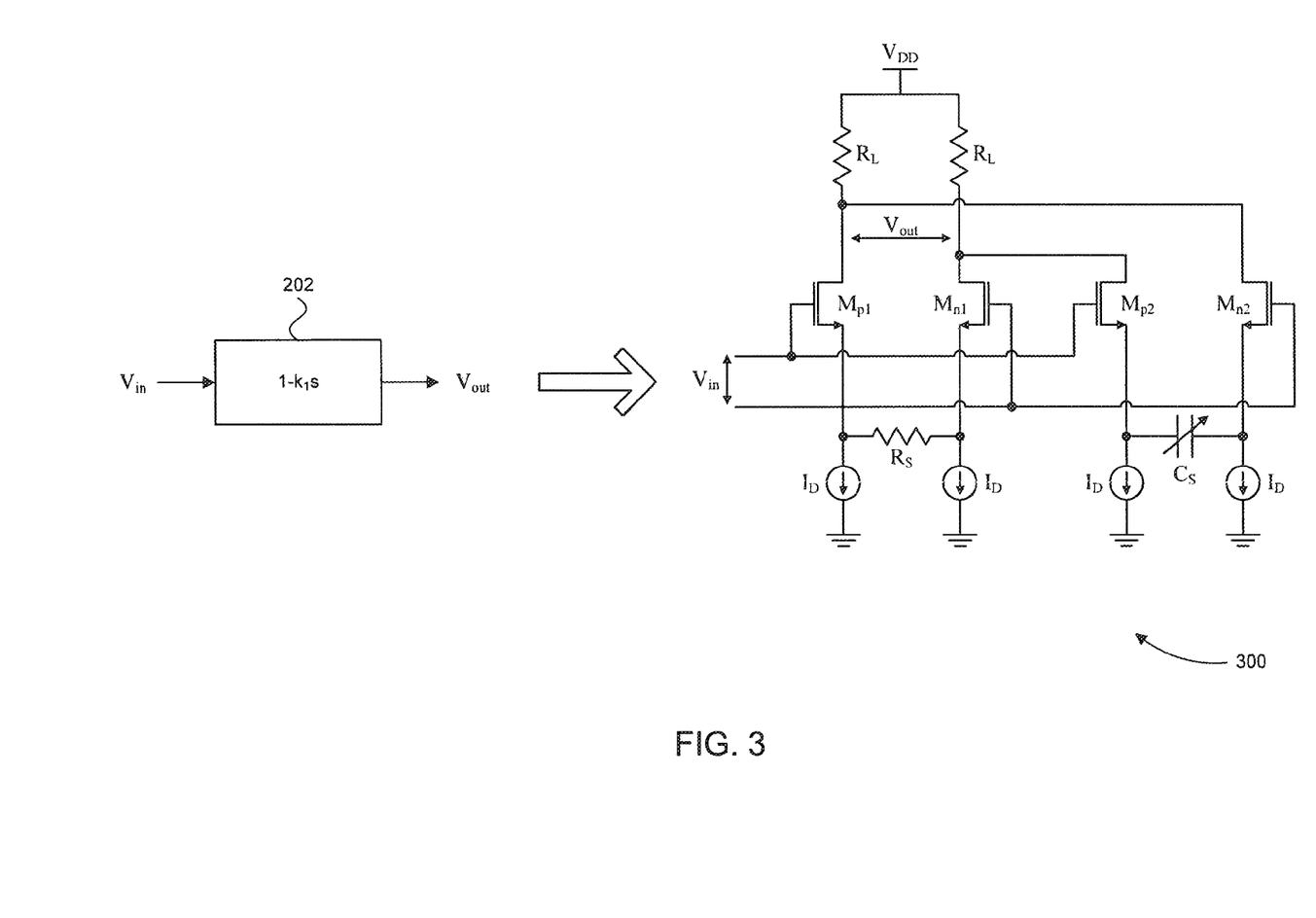
FIG. 3 illustrates an example circuit implementation of a transfer function shown in FIG. 2 in accordance with embodiments of the present disclosure.

Referring now to FIG. 3, an example circuit implementation 300 of transfer function 202 in FIG. 2 is shown. As can be seen from FIG. 3, circuit implementation 300 includes a first differential pair of n-type metal-oxide semiconductor field-effect transistors (MOSFETs) $M_{p1}$ and $K_{n1}$ with tail currents $I_D$ and a degeneration resistor $R_S$ coupled between the source terminals of the first differential pair. As can be further seen from FIG. 3, circuit implementation 300 includes a second differential pair of n-type MOSFETs $M_{p2}$ and $M_{n2}$ with tail currents $I_D$ and a degeneration capacitor $C_S$ coupled between the source terminals of the second differential pair. The gate terminals of each differential pair of transistors are coupled to the differential input signal and the drain terminals of each differential pair of transistors are coupled to load resistors RL and provide the differential output signal $V_{out}$, which represents the pre-cursor compensated version of the differential input signal $V_{in}$.

Either the capacitor $C_S$ or the resistor $R_S$ can be adjusted to vary the amount of pre-cursor compensation provided to the input signal Vin by circuit implementation 300. Effectively, adjusting the capacitor $C_S$ or resistor $R_S$ adjusts the gain at the Nyquist frequency of the differential input signal. As shown in FIG. 3, the capacitor $C_S$ is specifically made adjustable, but in other embodiments the resistor $R_S$ can be made adjustable in addition to or as an alternative to the capacitor $C_S$.

The simplified transfer function of circuit implementation 300 is given by the following equation:

$$H(s) = \frac{R_L}{R_S}(1 - sC_S R_S)$$

As can be seen, the simplified transfer function of circuit implementation 300 has the same general form as transfer function 202.

As will be appreciated by one of ordinary skill in the art, circuit implementation 300 can be readily implemented using p-type MOSFETs in place of the n-type MOSFETs or using other transistor types.

Figure 4:
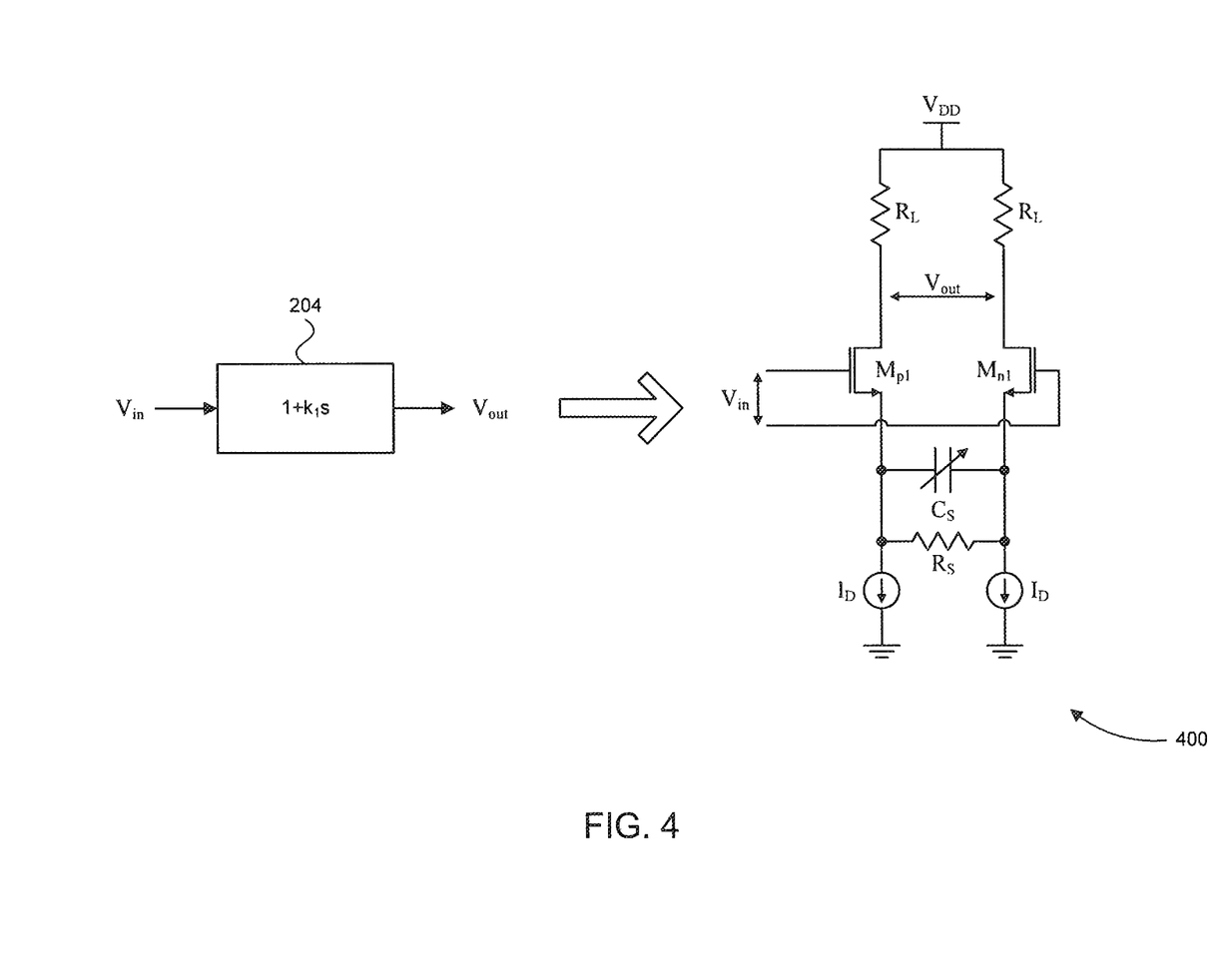
FIG. 4 illustrates an example circuit implementation of another transfer function shown in FIG. 2 in accordance with embodiments of the present disclosure.

Referring now to FIG. 4, an example circuit implementation 400 of transfer function 204 in FIG. 2 is shown. As can be seen from FIG. 4, circuit implementation 400 includes a differential pair of n-type MOSFETs $M_{p1}$ and $M_{n1}$ with tail currents $I_D$ and a degeneration resistor $R_S$ and capacitor $C_S$ coupled between the source terminals of the differential pair. The gate terminals of the differential pair of transistors are coupled to the differential input signal $V_{in}$ and the drain terminals of the differential pair of transistors are coupled to load resistors RL and provide the differential output signal $V_{out}$, which represents the post-cursor compensated version of the differential input signal $V_{in}$.

Either the capacitor $C_S$ or the resistor $R_S$ can be adjusted to vary the amount of post-cursor compensation provided to the input signal Vin by circuit implementation 400. Effectively, adjusting the capacitor $C_S$ or resistor $R_S$ adjusts the gain at the Nyquist frequency of the differential input signal. As shown in FIG. 4, the capacitor $C_S$ is specifically made adjustable, but in other embodiments the resistor $R_S$ can be made adjustable in addition to or as an alternative to the capacitor $C_S$.

The simplified transfer function of circuit implementation 300 is given by the following equation:

$$H(s) = \frac{R_L}{R_S}(1 + sC_S R_S)$$

As can be seen, the simplified transfer function of circuit implementation 400 has the same general form as transfer function 204.

As will be appreciated by one of ordinary skill in the art, circuit implementation 400 can be readily implemented using p-type MOSFETs in place of the n-type MOSFETs or using other transistor types.

Figure 5:
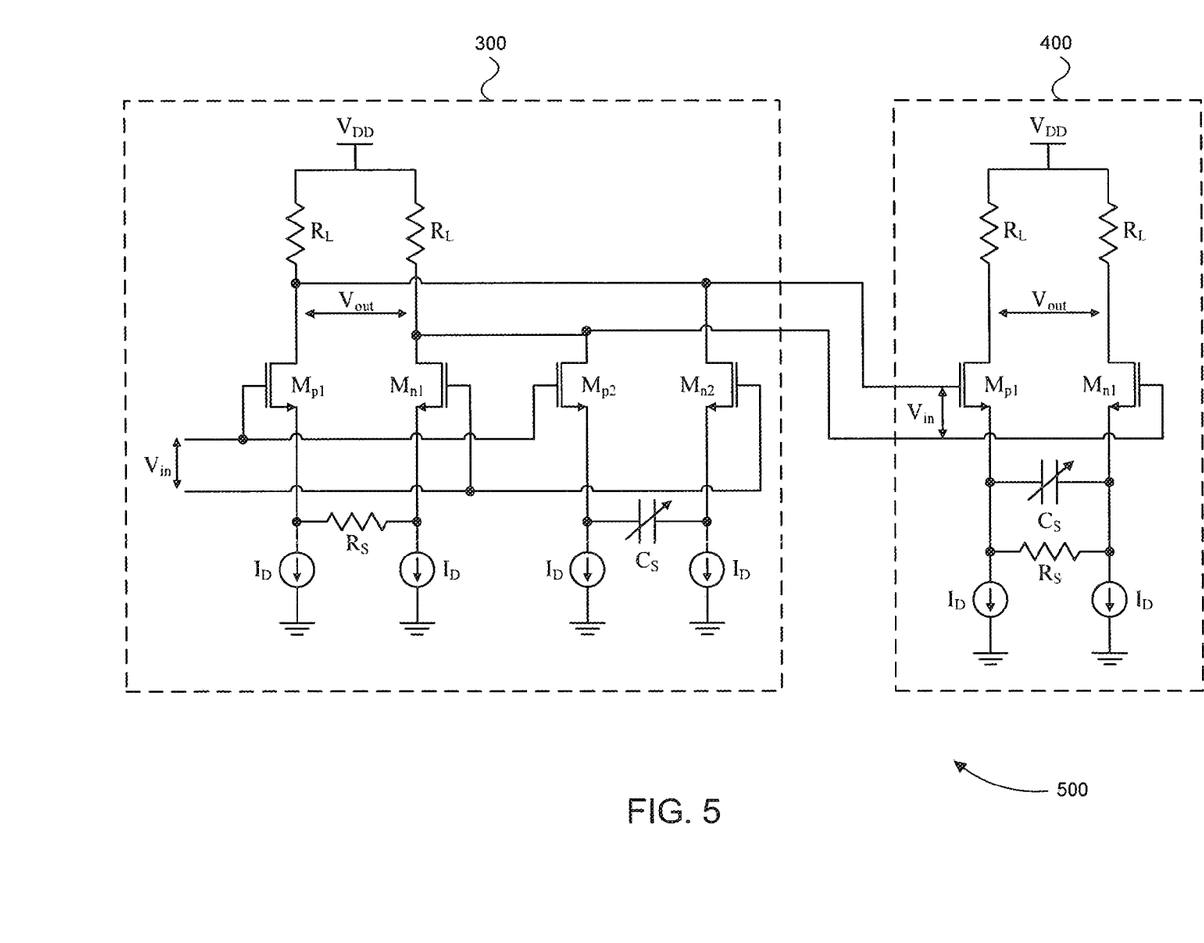
FIG. 5 illustrates a series coupled combination the circuit implementations in FIGS. 3 and 4 in accordance with embodiments of the present disclosure

Referring now to FIG. 5, a series coupled combination 500 of circuit implementation 300 and circuit implementation 400 is illustrated in accordance with embodiments of the present disclosure. As can be seen from FIG. 5, the output of circuit implementation 300 is coupled to the input of circuit implementation 400 to create a two-stage amplifier ISI compensation circuit with the transfer function shown in FIG. 2.

III. EXAMPLE OPERATING ENVIRONMENT

Figure 6:
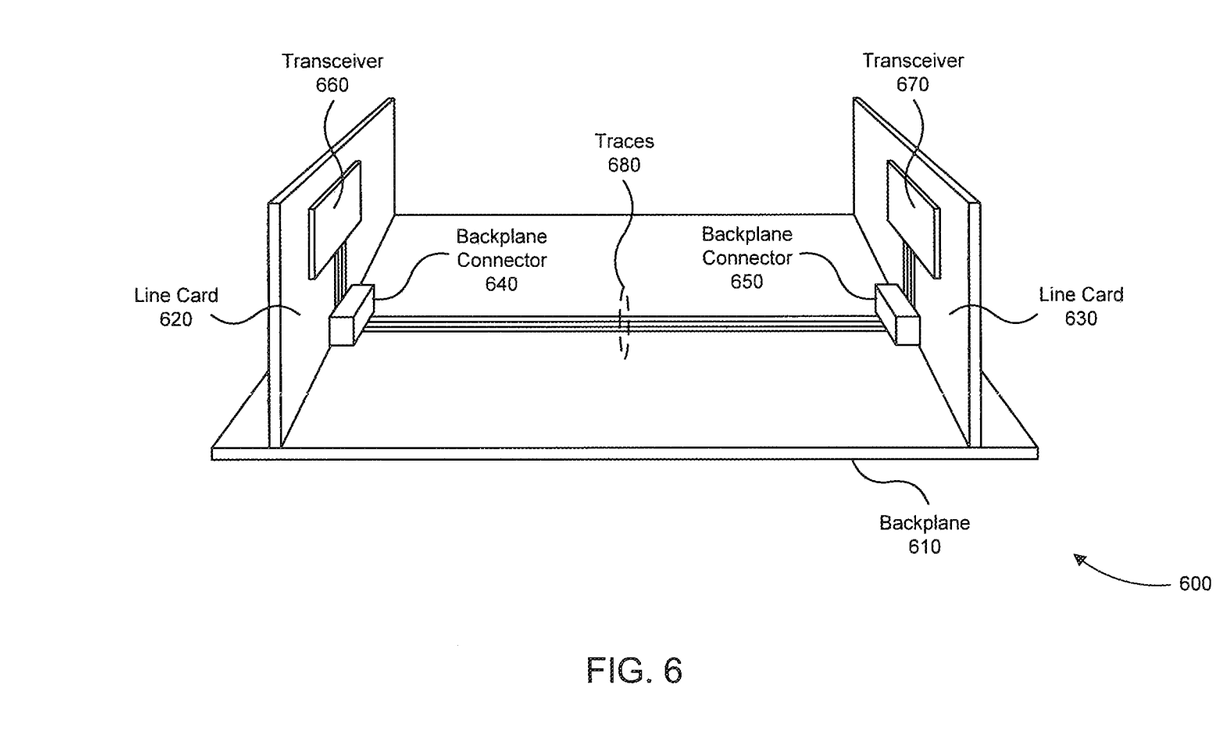
FIG. 6 illustrates an example backplane Ethernet system in which embodiments of a two stage amplifier ISI compensation circuit in which embodiments of the present disclosure can be implemented.

FIG. 6 illustrates an example Backplane Ethernet system 600 in which embodiments of the two stage amplifier ISI compensation described above can be implemented. As shown in FIG. 6, backplane Ethernet system 600 includes a backplane 610 and at least two line cards (or daughter cards) 620 and 630. Line cards 620 and 630 are respectively coupled to backplane 610 by connectors 640 and 650 (e.g., HM-Zd connectors) disposed on the surface of backplane 610 and on line cards 620 and 630 (e.g., the male part of the connectors can be disposed on backplane 610 and the female part of the connectors can be disposed on line cards 620 and 630), and each includes a respective transceiver 660 and 670.

In operation, transceivers 660 and 670 are configured to send data to, and receive data from, each other. The data communicated between the two transceivers is sent, via backplane connectors 640 and 650, over two pairs of traces 680 (e.g., copper traces) disposed on the surface of backplane 610: a first pair of traces is used to communicate data differentially to transceiver 670 from transceiver 660, and a second pair of traces is used to communicate data differentially to transceiver 660 from transceiver 670. In one embodiment, the data transmitted between the two transceivers is modulated using pulse amplitude modulation (PAM) (e.g., PAM-4). It should be noted that the number of traces 680 used to perform communication over backplane 610 can be more or less in other embodiments.

The rate at which data can be transmitted in backplane Ethernet systems, while still being reliably received, is typically limited by ISI caused by the dispersive nature of the copper traces, frequency dependent transmission losses caused primarily by skin effect and dielectric loss of the copper traces, and cross-talk from adjacent communication lines. The embodiments of the two stage amplifier ISI compensation circuit described above can be implemented in transceiver 660 and/or transceiver 670 systems for overcoming or mitigating these and other signal impairments to achieve required data rates over backplane 610.

It should be noted, that example Backplane Ethernet system 600 provides only one example system in which features of the present disclosure can be implemented. For example, features of the present disclosure can be implemented in communication systems that transmit and receive data formatted in accordance with signaling standards other than Ethernet. In addition, features of the present disclosure can be implemented in communication systems that transmit and receive data over mediums other than copper traces disposed on a printed circuit board. For example, other possible transmission mediums include coaxial cable, optical fiber (both single mode and multimode), twisted pair, radio, and satellite, to name a few. In addition, digital modulation schemes other than PAM can be used, including quadrature amplitude modulation (QAM) and quadrature phase shift keying (QPSK), for example.

IV. CONCLUSION

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present disclosure should not be limited by any of the above-described exemplary embodiments.

What is claimed is:

1. A pre-cursor compensation circuit for performing pre-cursor compensation on a differential input signal, the pre-cursor compensation circuit comprising:
   a first differential pair of transistors comprising first gate terminals coupled to the differential input signal, first source terminals coupled across a degeneration resistor, and first drain terminals coupled to a pre-cursor compensated version of the differential input signal; and
   a second differential pair of transistors comprising second gate terminals coupled to the differential input signal, second source terminals coupled across a degeneration capacitor, and second drain terminals coupled to the pre-cursor compensated version of the differential input signal.

2. The pre-cursor compensation circuit of claim 1, wherein the first differential pair of transistors and the second differential pair of transistors are n-channel metal-oxide semiconductor field-effect transistors.

3. The pre-cursor compensation circuit of claim 1, further comprising load resistors coupled to the first drain terminals and to the second drain terminals.

4. The pre-cursor compensation circuit of claim 1, wherein a capacitance of the degeneration capacitor is configured to be tuned to adjust gain at a Nyquist frequency of the differential input signal.

5. An intersymbol interference (ISI) compensation circuit for performing pre-cursor and post-cursor compensation on a differential input signal, the ISI compensation circuit comprising:
   a post-cursor compensation circuit configured to perform post-cursor compensation on the differential input signal; and
   a pre-cursor compensation circuit configured to perform pre-cursor compensation on the differential input signal, the pre-cursor compensation circuit comprising:
      a first differential pair of transistors comprising first gate terminals coupled to the differential input signal, first source terminals coupled across a degeneration resistor, and first drain terminals coupled to a pre-cursor compensated version of the differential input signal, and
      a second differential pair of transistors comprising second gate terminals coupled to the differential input signal, second source terminals coupled across a degeneration capacitor, and second drain terminals coupled to the pre-cursor compensated version of the differential input signal.

6. The ISI compensation circuit of claim 5, wherein the post-cursor compensation circuit and the pre-cursor compensation circuit are coupled in series.

7. The ISI compensation circuit of claim 6, wherein the pre-cursor compensation circuit is configured to process the differential input signal before the post-cursor compensation circuit.

8. The ISI compensation circuit of claim 5, wherein the first differential pair of transistors and the second differential pair of transistors are n-channel metal-oxide semiconductor field-effect transistors.

9. The ISI compensation circuit of claim 5, wherein the pre-cursor compensation circuit further comprises:
   load resistors coupled to the first drain terminals and to the second drain terminals.

10. The ISI compensation circuit of claim 5, wherein a capacitance of the degeneration capacitor is configured to be tuned to adjust gain at a Nyquist frequency of the differential input signal.

11. The ISI compensation circuit of claim 5, wherein the post-cursor compensation circuit comprises:
   a resistor-capacitor (RC) degenerated differential pair of transistors.

12. The ISI compensation circuit of claim 11, wherein the RC degenerated differential pair of transistors comprises:
   gate terminals coupled to the differential input signal.

13. The ISI compensation circuit of claim 11, wherein the RC degenerated differential pair of transistors comprises:
   gate terminals coupled to the pre-cursor compensated version of the differential input signal.

14. A line card configured to receive a differential input signal via traces on a backplane, the line card comprising:
   a transceiver; and
   a backplane connector configured to couple the transceiver to the traces on the backplane to provide the differential input signal to the transceiver for processing,
   wherein the transceiver comprises a pre-cursor compensation circuit configured to perform pre-cursor compensation on the differential input signal, the pre-cursor compensation circuit comprising:
      a first differential pair of transistors comprising first gate terminals coupled to the differential input signal, first source terminals coupled across a degeneration resistor, and first drain terminals coupled to a pre-cursor compensated version of the differential input signal, and
      a second differential pair of transistors comprising second gate terminals coupled to the differential input signal, second source terminals coupled across a degeneration capacitor, and second drain terminals coupled to the pre-cursor compensated version of the differential input signal.

15. The line card of claim 14, wherein the transceiver further comprises:
   a post-cursor compensation circuit configured to perform post-cursor compensation on the differential input signal.

16. The line card of claim 15, wherein the post-cursor compensation circuit and the pre-cursor compensation circuit are coupled in series.

17. The line card of claim 15, wherein the post-cursor compensation circuit comprises:
   a resistor-capacitor (RC) degenerated differential pair of transistors.

18. The line card of claim 14, wherein the first differential pair of transistors and the second differential pair of transistors are n-channel metal-oxide semiconductor field-effect transistors.

19. The line card of claim 14, wherein the pre-cursor compensation circuit further comprises:
   load resistors coupled to the first drain terminals and to the second drain terminals.

20. The line card of claim 14, wherein a capacitance of the degeneration capacitor is configured to be tuned to adjust gain at a Nyquist frequency of the differential input signal.

* * * * *